United States Patent
Sharon et al.

(10) Patent No.: US 12,348,245 B1
(45) Date of Patent: Jul. 1, 2025

(54) DATA STORAGE DEVICE WITH EFFICIENT DECODER POOL AND METHOD FOR ON-THE-FLY DECODER INITIALIZATION

(71) Applicant: Western Digital Technologies, Inc., San Jose, CA (US)

(72) Inventors: Eran Sharon, Rishon Lezion (IL); Ran Zamir, Ramat Gan (IL); Yoav Porat, Lehavim (IL); Yan Dumchin, Beer Sheva (IL)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/397,133

(22) Filed: Dec. 27, 2023

(51) Int. Cl.
*H03M 13/00* (2006.01)
*H03M 13/01* (2006.01)
*H03M 13/11* (2006.01)
*H03M 13/15* (2006.01)

(52) U.S. Cl.
CPC ..... *H03M 13/1128* (2013.01); *H03M 13/015* (2013.01); *H03M 13/1575* (2013.01)

(58) Field of Classification Search
CPC ........... H03M 13/1128; H03M 13/611; H03M 13/1105; H03M 13/015; H03M 13/1575
See application file for complete search history.

(56) References Cited

U.S. PATENT DOCUMENTS

| | | | |
|---|---|---|---|
| 7,805,662 B2* | 9/2010 | Ma | H03M 13/1515 714/756 |
| 9,246,516 B2* | 1/2016 | Kwok | H03M 13/6502 |
| 9,588,840 B2* | 3/2017 | Chung | G06F 11/1048 |
| 9,954,553 B1* | 4/2018 | Langhammer | H03M 13/1595 |
| 10,372,531 B2* | 8/2019 | Prathapan | H03M 13/356 |
| 11,750,223 B2* | 9/2023 | Fan | H03M 13/1545 714/785 |

* cited by examiner

*Primary Examiner* — Esaw T Abraham
(74) *Attorney, Agent, or Firm* — Crowell & Moring LLP (57) ABSTRACT

A shared decoder pool is susceptible to head-of-line blocking when the decoding of a given data block delays the decoding of other data blocks pipelined in the decoder. While the problem can be avoided by not using a pipeline operation, the benefits of pipelining would be lost. In one embodiment provided herein, the syndrome of an error pattern is calculated in parallel with data being written in an input buffer for the decoder. Parallelizing the syndrome calculation and the filling of the decoder's input buffer can avoid the head-of-line blocking problem noted above while still achieving the benefits of pipelining. In another embodiment, a similar technique is used in a bit error rate estimation scan (BES) operation. Other embodiments are provided.

16 Claims, 12 Drawing Sheets

DATA STORAGE DEVICE WITH EFFICIENT DECODER POOL AND METHOD FOR ON-THE-FLY DECODER INITIALIZATION

BACKGROUND

A host can write data to and/or read data from a memory in a data storage device. The data storage device can comprise one or more decoders for use in correcting errors in data read from the memory.

DETAILED DESCRIPTION

The following embodiments generally relate to a data storage device with efficient decoder pool and method for on-the-fly decoder initialization. In one embodiment, a data storage device is provided comprising a memory; a decoder; an input buffer; and one or more processors. The one or more processors, individually or in combination, are configured to: monitor the input buffer; and in response to detecting that data read from the memory is being written in the input buffer, cause the decoder to perform a syndrome calculation to calculate a syndrome for the data in parallel with the data being written in the input buffer, wherein by a time the data is completely written in the input buffer, at least part of the syndrome calculation is complete (e.g., the syndrome calculation is almost complete or some of the calculations are complete).

In another embodiment, a method is provided that is performed in a data storage device comprising a memory, a decoder, and an input buffer. The method comprises: identifying a plurality of hypothetical read thresholds for the memory; and after the plurality of hypothetical read thresholds have been identified: calculating a syndrome weight for each of the plurality of hypothetical read thresholds; and using the calculated syndrome weights for each of the plurality of hypothetical read thresholds in a bit error rate estimation scan (BES) operation.

In yet another embodiment, a data storage device is provided comprising: a memory; a decoder; an input buffer; and means for causing the decoder to perform a syndrome calculation to calculate a syndrome for the data in parallel with the data being written in the input buffer in response to detecting that data read from the memory is being written in the input buffer, wherein by a time the data is completely written in the input buffer, at least part of the syndrome calculation is complete.

Other embodiments are possible, and each of the embodiments can be used alone or together in combination. Accordingly, various embodiments will now be described with reference to the attached drawings.

EMBODIMENTS

The following embodiments relate to a data storage device (DSD). As used herein, a "data storage device" refers to a non-volatile device that stores data. Examples of DSDs include, but are not limited to, hard disk drives (HDDs), solid state drives (SSDs), tape drives, hybrid drives, etc. Details of example DSDs are provided below.

Figures 1A, 1B:
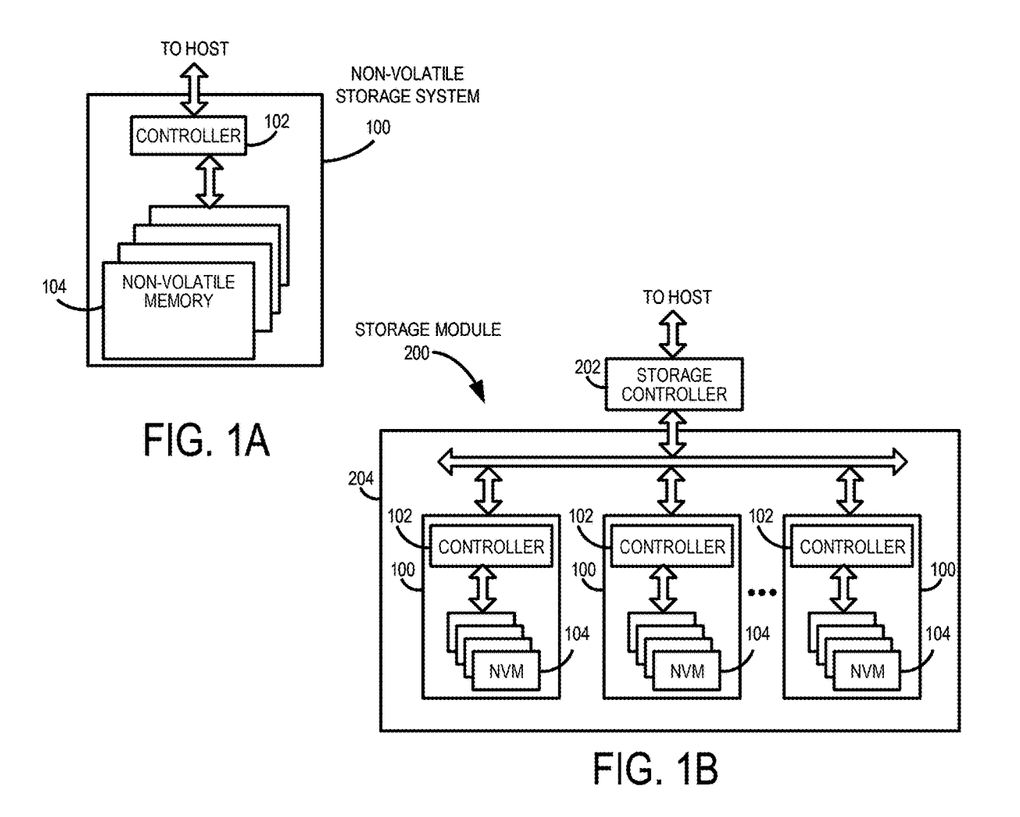
FIG. 1A is a block diagram of a data storage device of an embodiment.
FIG. 1B is a block diagram illustrating a storage module of an embodiment.
Figure 1C:
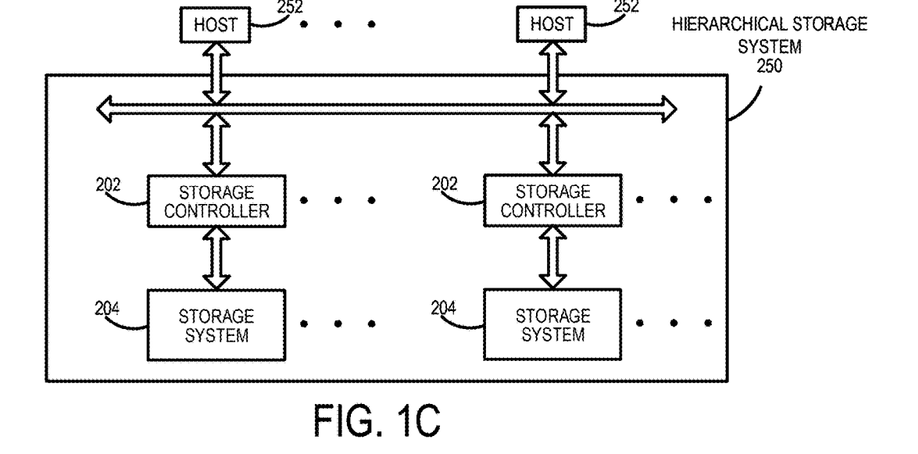
FIG. 1C is a block diagram illustrating a hierarchical storage system of an embodiment.

Examples of data storage devices suitable for use in implementing aspects of these embodiments are shown in FIGS. 1A-1C. It should be noted that these are merely examples and that other implementations can be used. FIG. 1A is a block diagram illustrating the data storage device 100 according to an embodiment. Referring to FIG. 1A, the data storage device 100 in this example includes a controller 102 coupled with a non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. The controller 102 interfaces with a host system and transmits command sequences for read, program, and erase operations to non-volatile memory die 104. Also, as used herein, the phrase "in communication with" or "coupled with" could mean directly in communication/coupled with or indirectly in communication/coupled with through one or more components, which may or may not be shown or described herein. The communication/coupling can be wired or wireless.

Figure 2A:
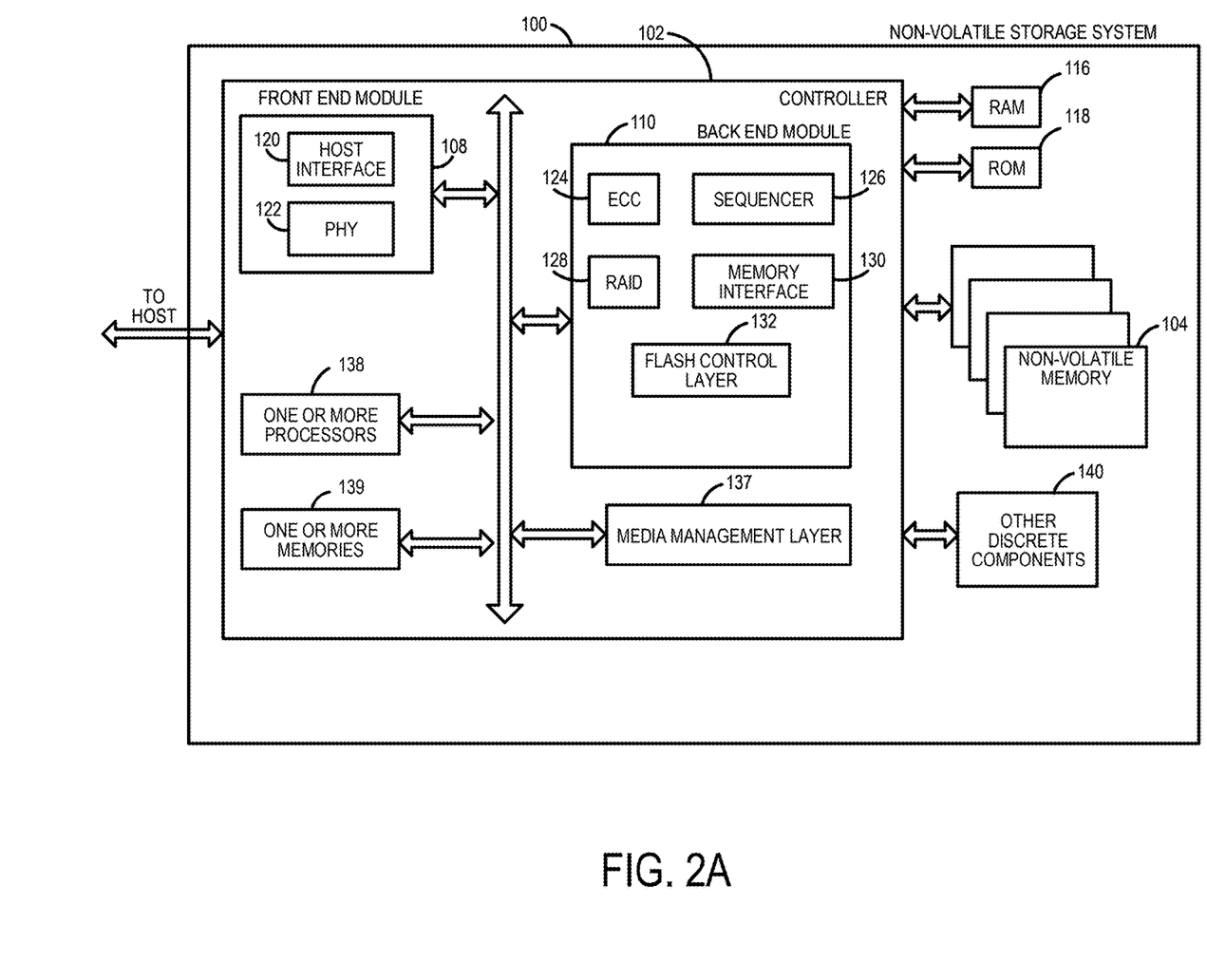
FIG. 2A is a block diagram illustrating components of the controller of the data storage device illustrated in FIG. 1A according to an embodiment.

The controller 102 (which may be a non-volatile memory controller (e.g., a flash, resistive random-access memory (ReRAM), phase-change memory (PCM), or magnetoresistive random-access memory (MRAM) controller)) can include one or more components, individually or in combination, configured to perform certain functions, including, but not limited to, the functions described herein and illustrated in the flow charts. For example, as shown in FIG. 2A, the controller 102 can comprise one or more processors 138 that are, individually or in combination, configured to perform functions, such as, but not limited to the functions described herein and illustrated in the flow charts, by executing computer-readable program code stored in one or more non-transitory memories 139 inside the controller 102 and/or outside the controller 102 (e.g., in random access memory (RAM) 116 or read-only memory (ROM) 118). As another example, the one or more components can include circuitry, such as, but not limited to, logic gates, switches, an application specific integrated circuit (ASIC), a programmable logic controller, and an embedded microcontroller.

In one example embodiment, the non-volatile memory controller 102 is a device that manages data stored on non-volatile memory and communicates with a host, such as a computer or electronic device, with any suitable operating system. The non-volatile memory controller 102 can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware (and/or other metadata used for housekeeping and tracking) to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC) (e.g., dual-level cells, triple-level cells (TLC), quad-level cells (QLC), etc.) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, the data storage device 100 may be a card-based system, such as a secure digital (SD) or a micro secure digital (micro-SD) card. In an alternate embodiment, the data storage device 100 may be part of an embedded data storage device.

Although, in the example illustrated in FIG. 1A, the data storage device 100 (sometimes referred to herein as a storage module) includes a single channel between controller 102 and non-volatile memory die 104, the subject matter described herein is not limited to having a single memory channel. For example, in some architectures (such as the ones shown in FIGS. 1B and 1C), two, four, eight or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile data storage devices 100. As such, storage module 200 may include a storage controller 202 that interfaces with a host and with data storage device 204, which includes a plurality of data storage devices 100. The interface between storage controller 202 and data storage devices 100 may be a bus interface, such as a serial advanced technology attachment (SATA), peripheral component interconnect express (PCIe) interface, double-data-rate (DDR) interface, or serial attached small scale compute interface (SAS/SCSI). Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective data storage device 204. Host systems 252 may access memories within the storage system 250 via a bus interface. In one embodiment, the bus interface may be a Non-Volatile Memory Express (NVMe) or Fibre Channel over Ethernet (FCoE) interface. In one embodiment, the system illustrated in FIG. 1C may be a rack mountable mass storage system that is accessible by multiple host computers, such as would be found in a data center or other location where mass storage is needed.

Referring again to FIG. 2A, the controller 102 in this example also includes a front-end module 108 that interfaces with a host, a back-end module 110 that interfaces with the one or more non-volatile memory die 104, and various other components or modules, such as, but not limited to, a buffer manager/bus controller module that manage buffers in RAM 116 and controls the internal bus arbitration of controller 102. A module can include one or more processors or components, as discussed above. The ROM 118 can store system boot code. Although illustrated in FIG. 2A as located separately from the controller 102, in other embodiments one or both of the RAM 116 and ROM 118 may be located within the controller 102. In yet other embodiments, portions of RAM 116 and ROM 118 may be located both within the controller 102 and outside the controller 102.

Front-end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back-end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. The controller 102 in this example also comprises a media management layer 137 and a flash control layer 132, which controls the overall operation of back-end module 110.

The data storage device 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
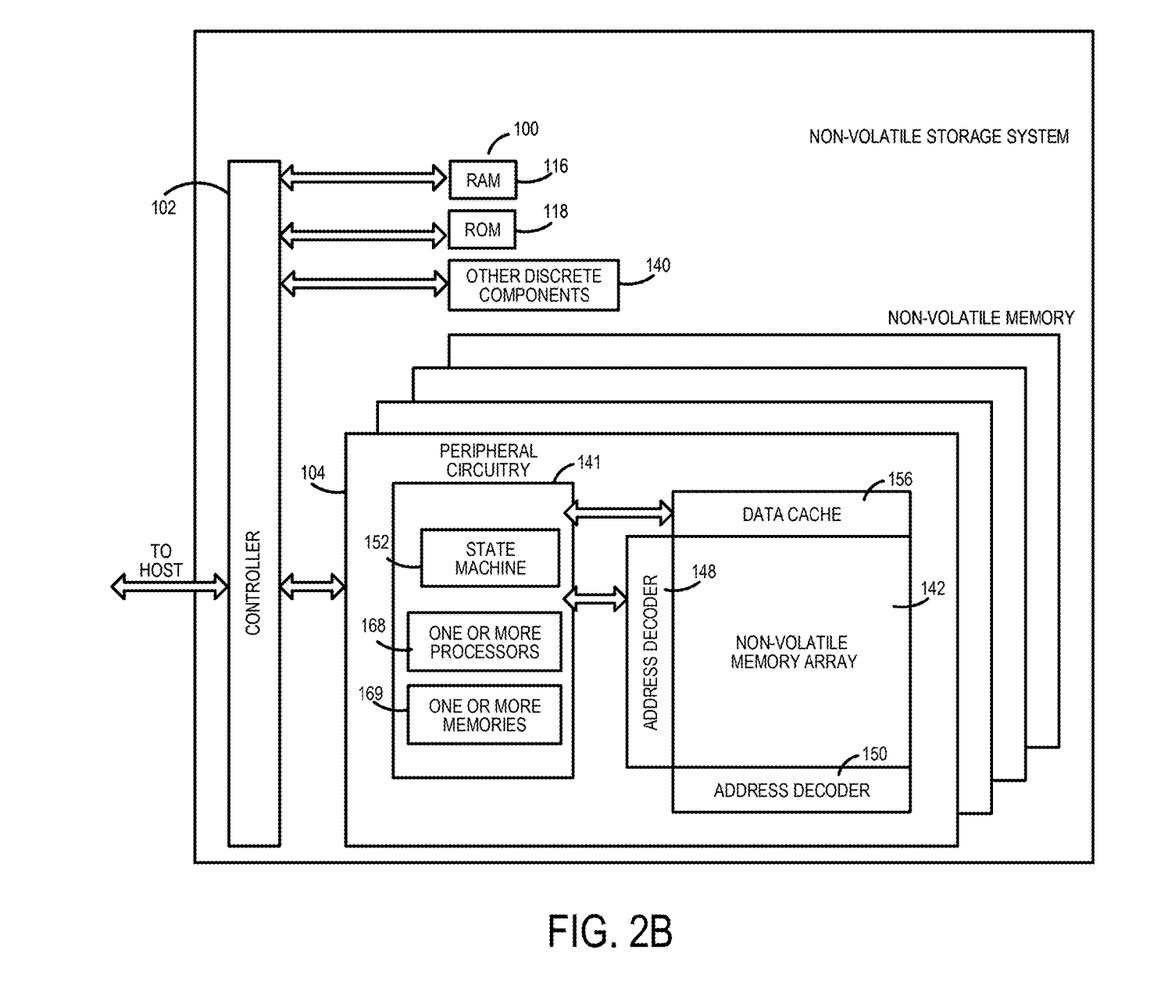
FIG. 2B is a block diagram illustrating components of the data storage device illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two-dimensional and/or three-dimensional configuration. Non-volatile memory die 104 further includes a data cache 156 that caches data. The peripheral circuitry 141 in this example includes a state machine 152 that provides status information to the controller 102. The peripheral circuitry 141 can also comprise one or more components that are, individually or in combination, configured to perform certain functions, including, but not limited to, the functions described herein and illustrated in the flow charts. For example, as shown in FIG. 2B, the memory die 104 can comprise one or more processors 168 that are, individually or in combination, configured to execute computer-readable program code stored in one or more non-transitory memories 169, stored in the memory array 142, or stored outside the memory die 104. As another example, the one or more components can include circuitry, such as, but not limited to, logic gates, switches, an application specific integrated circuit (ASIC), a programmable logic controller, and an embedded microcontroller.

In addition to or instead of the one or more processors 138 (or, more generally, components) in the controller 102 and the one or more processors 168 (or, more generally, components) in the memory die 104, the data storage device 100 can comprise another set of one or more processors (or, more generally, components). In general, wherever they are located and however many there are, one or more processors (or, more generally, components) in the data storage device 100 can be, individually or in combination, configured to perform various functions, including, but not limited to, the functions described herein and illustrated in the flow charts. For example, the one or more processors (or components) can be in the controller 102, memory device 104, and/or other location in the data storage device 100. Also, different functions can be performed using different processors (or components) or combinations of processors (or components). Further, means for performing a function can be implemented with a controller comprising one or more components (e.g., processors or the other components described above).

Returning again to FIG. 2A, the flash control layer 132 (which will be referred to herein as the flash translation layer (FTL) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may be written in only multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
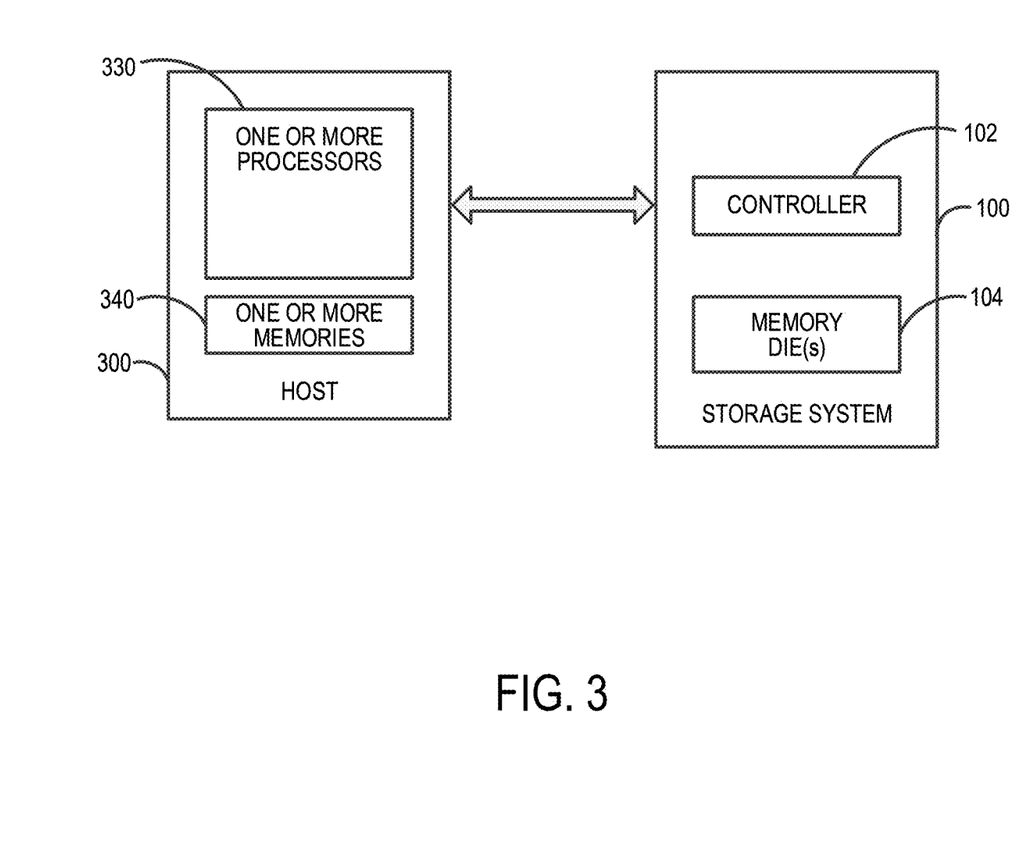
FIG. 3 is a block diagram of a host and a data storage device of an embodiment.

Turning again to the drawings, FIG. 3 is a block diagram of a host 300 and data storage device 100 of an embodiment. The host 300 can take any suitable form, including, but not limited to, a computer, a mobile phone, a tablet, a wearable device, a digital video recorder, a surveillance system, etc. The host 300 in this embodiment (here, a computing device) comprises one or more processors 330 and one or more memories 340. In one embodiment, computer-readable program code stored in the one or more memories 340 configures the one or more processors 330 to perform the acts described herein as being performed by the host 300. So, actions performed by the host 300 are sometimes referred to herein as being performed by an application (computer-readable program code) run on the host 300. For example, the host 300 can be configured to send data (e.g., initially stored in the host's memory 340) to the data storage device 100 for storage in the data storage device's memory 104.

As flash storage solutions evolve (especially in enterprise and data centers), the quality of service (QoS) requirements from flash controllers becomes stricter, and creative solutions may be needed in order to ensure consistent latency across varying conditions exhibited by flash memories due to process variations and changing operational conditions (e.g., program/erase (P/E) cycles, temperature, data retention, disturb effects, etc.). The following embodiments provide an efficient shared decoder pool (PoD) optimized to ensure high performance and quality-of-service.

Figure 4:
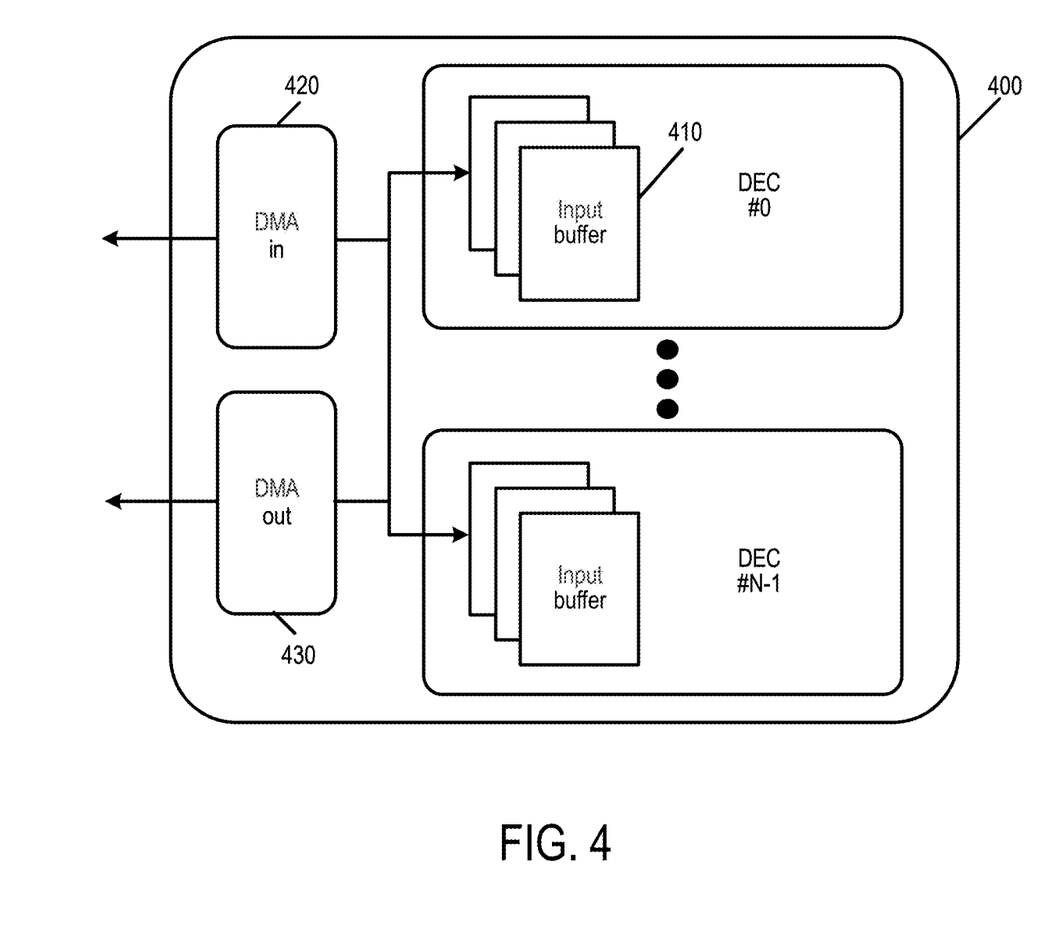
FIG. 4 is an illustration of a shared decoder pool of an embodiment.

In recent years, as product requirements increase, the limit has been reached of the maximal decoding throughput that can be achieved from a single decoder. In addition, using a single decoding engine may result in "head of line blocking" scenarios where a high BER event results in high decoding latency and blocks service of other decoding requests, which can degrade QoS and may be unacceptable in a QoS-driven system. As a result, multiple decoder cores, referred to as a "decoder pool" have been used. FIG. 4 is a diagram of a shared decoder pool 400 of an embodiment. As shown in FIG. 4, in this example, the shared decoder pool 400 comprises a plurality of decoders (each with a respective plurality of input buffers 410), which are coupled with a DMA input module 420 and a DMA output module 430. This system performs an abstraction of the decoders into a simple interface, while performing input-output (I-O) operations and internal arbitration.

However, a problem can occur with QoS-optimized pools. For example, state-of-the-art error correcting codes (ECCs) use iterative decoders. Iterative decoding algorithms (and low-density parity-check code (LDPC) in particular) involve iterating over the data until the decoder converges to the correct codeword—correcting all errors. These codes provide excellent performance and close to Shannon-limit correction capability. On the other hand, the downside of using an iterative scheme is that the decoding time is unpredictable and depends on the number of errors and the specific error pattern, which are unknown before the decoding operation is complete.

To ensure fast and efficient operation, the decoding operations can be pipelined. As such, a decoder pool architecture may experience scenarios of head-of-line (HoL) blocking. Subsequent ECC blocks ("eblocks") are loaded into the decoding engine before the previous decoding operation is completed and, therefore, may get stuck if the previous decoding operation takes a long time to decode (e.g., due to a high BER event). This can severely impact the QoS, as the eblocks that are stuck waiting for the previous decoding to finish would, thus, exhibit a high read latency, while they could have been easily decoded quickly in another decoder engine (as they likely exhibit low BER). So, in such a POD design, a single high BER event can result in multiple eblocks being delayed and exhibiting high latency.

Figure 5:
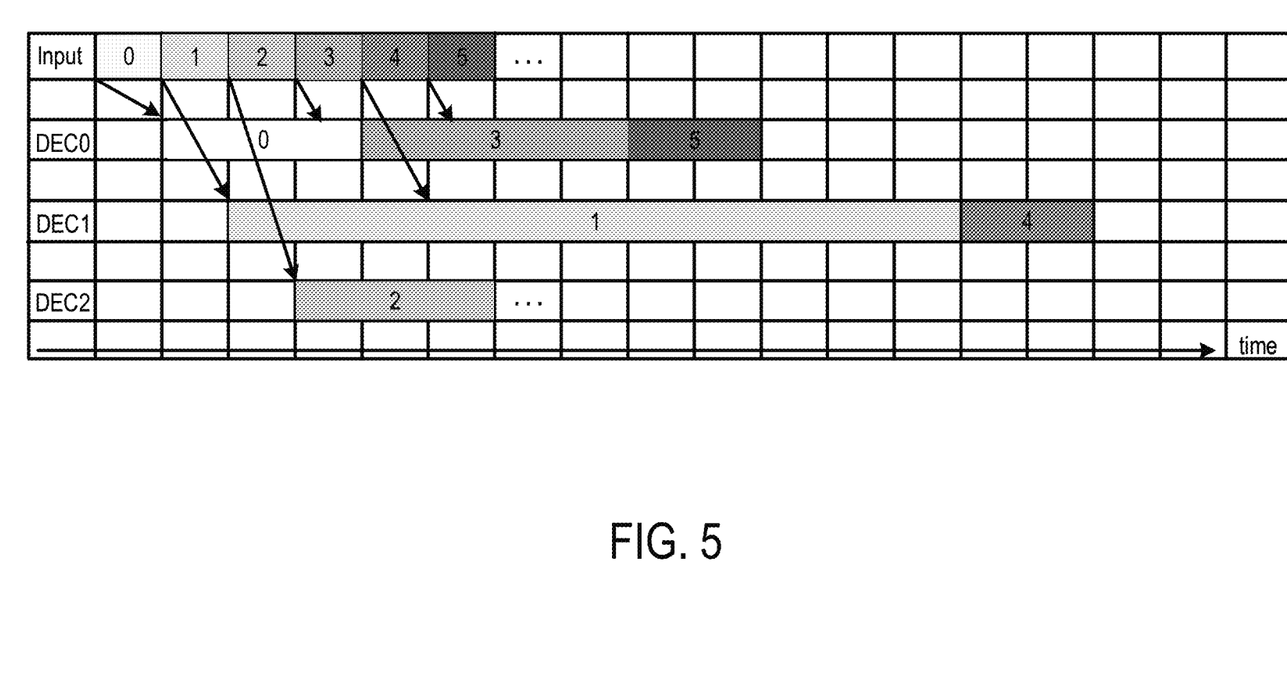
FIG. 5 is an illustration of a shared decoder pool of an embodiment with head-of-line blocking.

FIG. 5 illustrates a shared decoder pool with three decoder cores that is susceptible to HoL blocking. More specifically, FIG. 5 shows an example timing diagram describing the input and decoding times of eblocks through the system. Due to the pipelined operation, the following eblock is loaded before the previous is finished. Therefore, it is unknown when it will finish. In this example, eblock #4 is greatly delayed because it is loaded to engine #1 and is unfortunate to follow eblock #1, which has a very long decoding time. In some implementations, the eblock pipeline may be deeper, and several eblocks may be loaded to an engine before the first is done, making the HoL blocking even worse.

Figure 6:
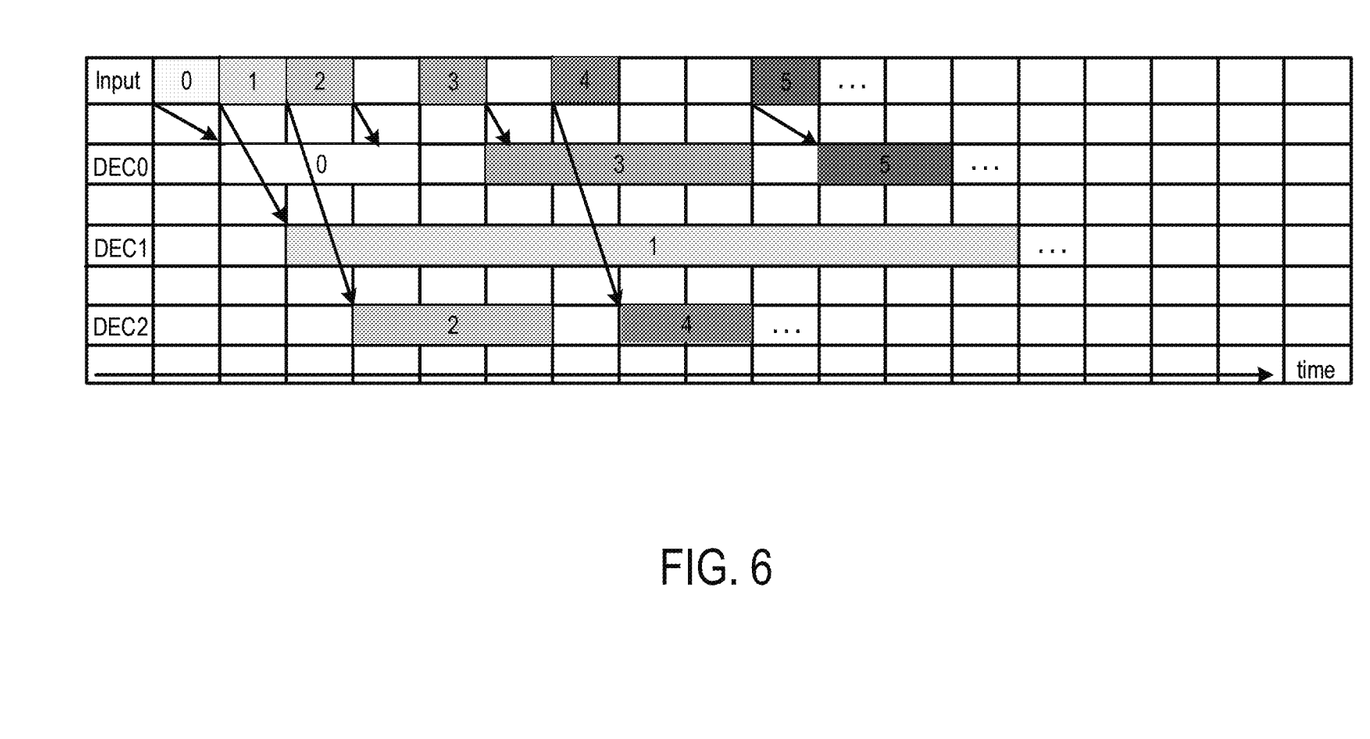
FIG. 6 is an illustration of a shared decoder pool of an embodiment without head-of-line blocking.

To resolve the HoL blocking, one solution is to avoid loading the next eblock until the previous eblock is done decoding; therefore, avoiding the HoL blocking. However, this essentially means cancelling the pipeline operation, which can have a significant degradation on the decoding throughput as measured in number of eblocks decoder per second or number of Bytes decoded per second, thus requiring more decoder cores/higher clock frequencies to achieve the same throughput requirement. This is illustrated in FIG. 6. In this example, eblocks are loaded into an engine only after the previous eblock is finished decoding and the decoder is guaranteed to be free for a new eblock. As can be seen, this cancels the pipelined operation and reduces the throughput as can be evident by the idle times of the input and decoder engines operation.

The following embodiments observe that when using the HoL decoder pool as described above, the decoder engines are idle during the input operation. This is essential to avoid the HoL blocking scenario as described above. The following embodiments observe that a common method in LDPC decoding is first calculating the syndrome of the error pattern. This is useful to estimate the BER and is an essential part of the decoding operation if a bit-flipping decoding algorithm is used, which is ubiquitous in storage ECC solutions. The calculation of the syndrome is both read-only from the memory and can be done in the order of the data. Using this, the following embodiments propose to parallelize the syndrome calculation and the data input (the filling of the decoder's input buffer). This is only viable in the HoL blocking setting as, in other cases, there is a pipeline between eblocks, and the decoder is occupied with the decoding of the previous eblock when inputting the next one.

Figure 7A:
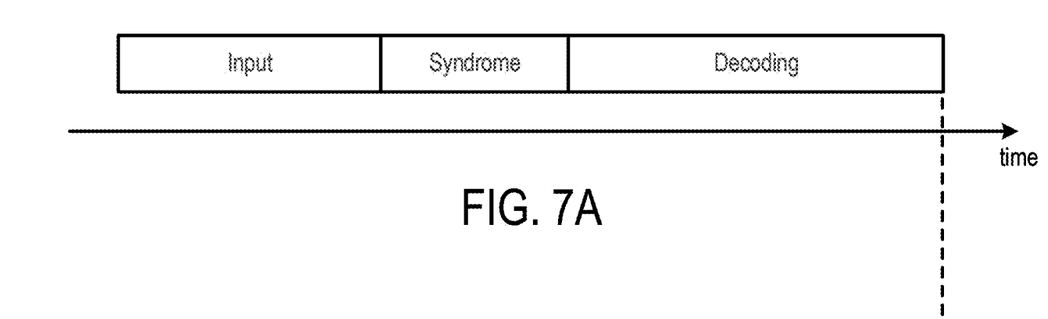
FIG. 7A is a timing diagram of a non-parallelized syndrome calculation of an embodiment.
Figure 7B:
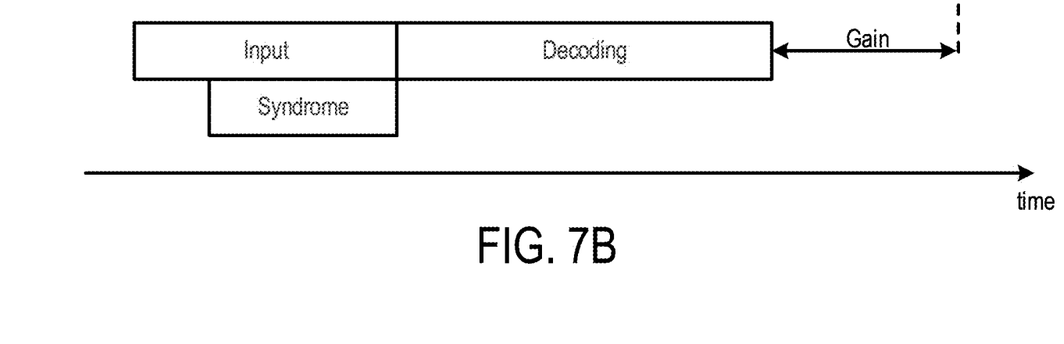
FIG. 7B is a timing diagram of a parallelized syndrome calculation of an embodiment.

The decoder is usually much faster than the input because of increased parallelism and/or higher clock. Also, the decoder rate can be lower than input rate, in which case, when the input is done, some of the syndrome calculation is complete, and some of the latency is still reduced. This means the decoder can keep up with the input rate. When the data input is done, so is the syndrome calculation. This syndrome calculation usually takes one decoding iteration. FIG. 7A is a timing diagram of a non-parallelized syndrome calculation of an embodiment, and FIG. 7B is a timing diagram of a parallelized syndrome calculation of an embodiment. In performance check points, the decoder usually performs just a few iterations (e.g., two-to-three iterations), so reduction of whole iteration is substantial and significantly increases the decoding throughput.

Figure 8:
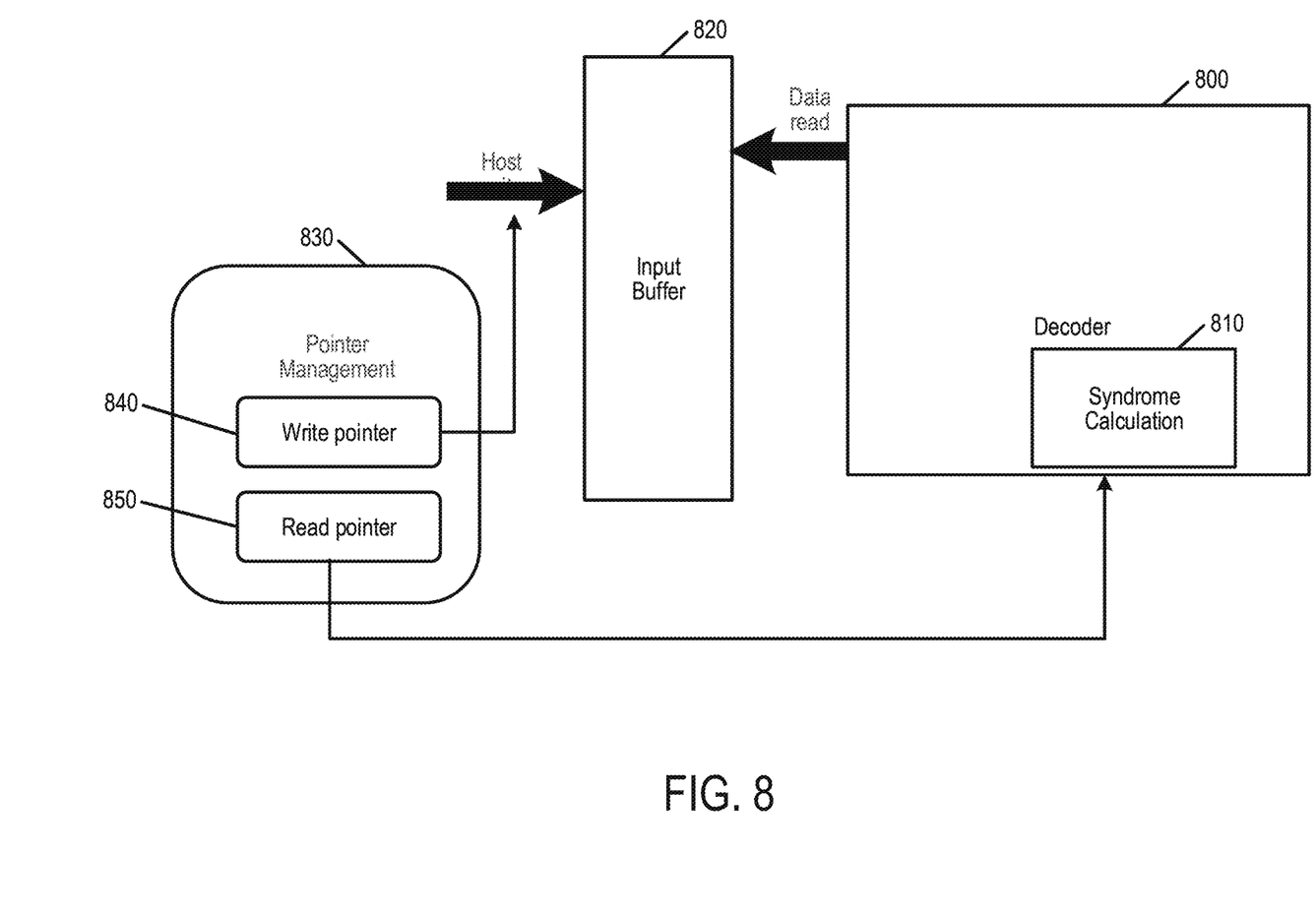
FIG. 8 is a diagram illustrating a parallelized syndrome calculation of an embodiment.

One embodiment provides a parallelized syndrome calculation implementation. The parallelized syndrome calculation is implemented by adding a buffer access management unit that monitors the state of the input buffer. When new data is written, the unit signals to the decoder to read the new data and add it the syndrome calculation. As the decoder is usually faster than the input process, the syndrome calculation can essentially be performed in parallel to the input and should be complete as soon as the last of the input data is written. An example implementation of a parallelized syndrome calculation of an embodiment is presented in FIG. 8. As shown in FIG. 8, the decoder 800 has a syndrome calculation module 810. The decoder 800 provides data read from memory to an input buffer 820. A pointer management module 830 provides a write pointer 840 to the input buffer 820 and provides a read pointer 850 to the syndrome calculation module 810. In this example, the data row is processed as soon as the read pointer increments rather than staring the processing after all the data rows are valid.

In another embodiment, the techniques discussed above can be applied to the read threshold calibration. In NAND memory, each logical page includes a combination of several read thresholds. As part of the read threshold calibration, different read threshold combinations are identified and the syndrome weight (SW) is calculated for each. The read thresholds may also be emulated by calculating the bit values for each voltage bin from a limited set of reads. The emulation produces hypothesis for each combination in order to converge on the correct read threshold location. This operation may be denoted as bit error rate scan ("BES") operation. By using the above circuit, the SW calculation may start immediately after the start of the hypothesis calculation. This embodiment is illustrated in FIGS. 9, 10A, and 10B.

Figure 9:
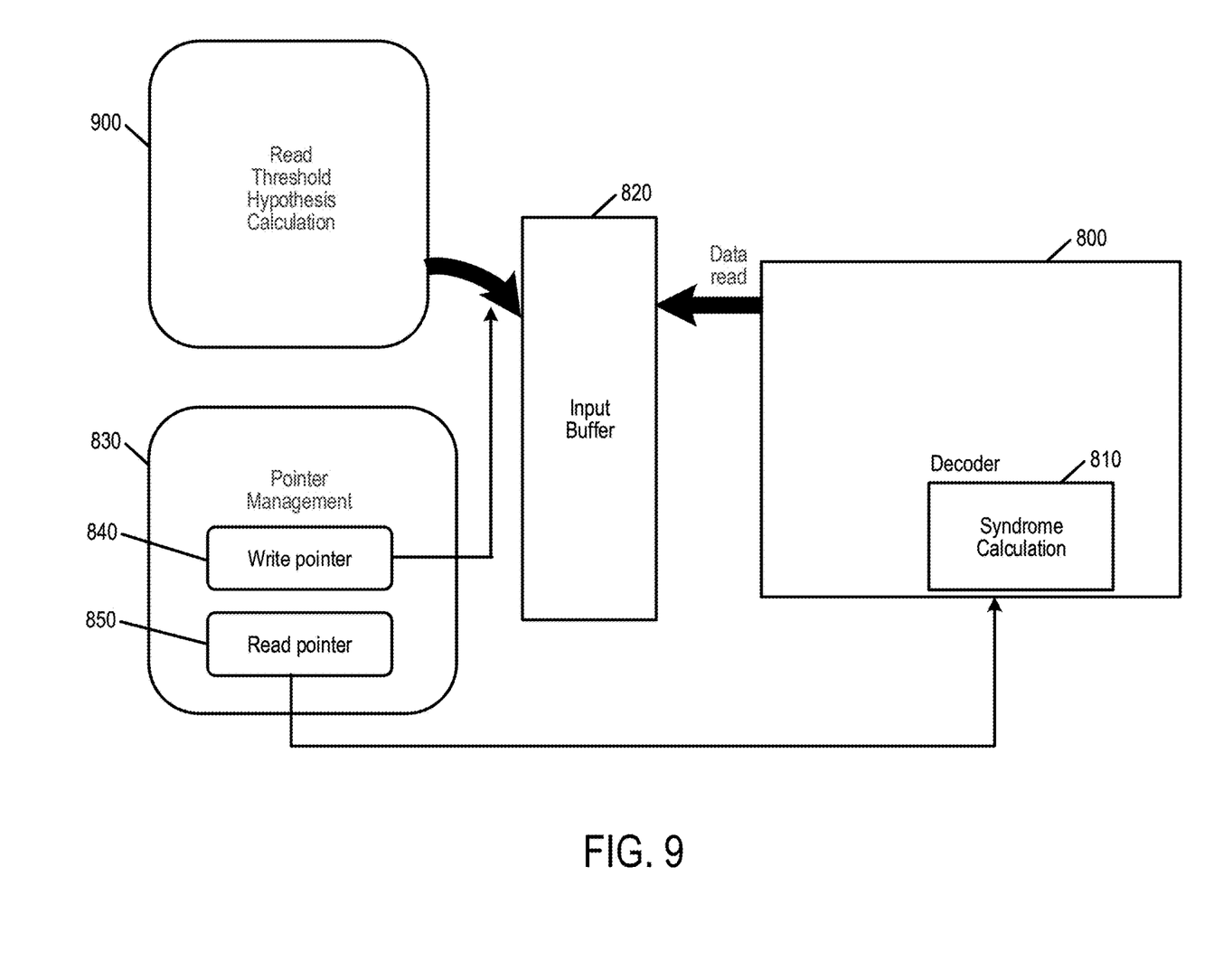
FIG. 9 is a diagram illustrating a parallelized bit error rate estimation scan (BES) syndrome calculation of an embodiment where a parallel syndrome weight calculation is used.
Figure 10A:
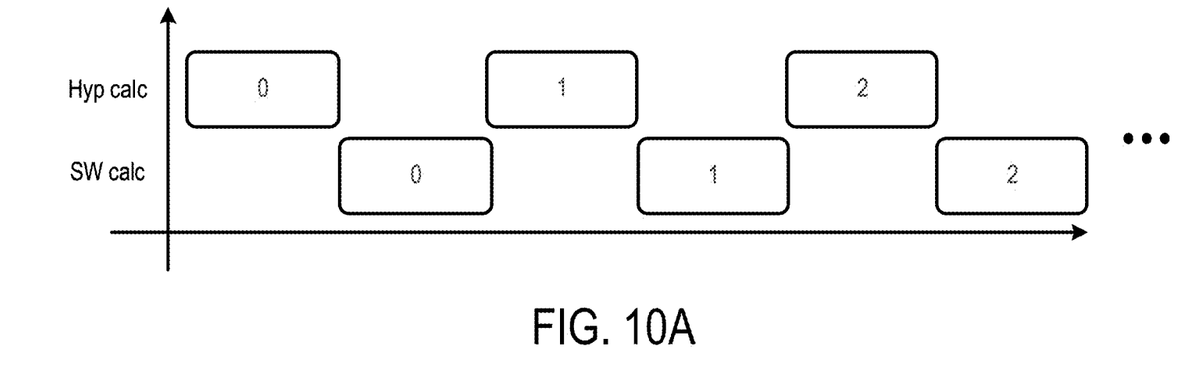
FIGS. 10A and 10B are diagrams illustrating a BES operation with parallel syndrome-weight calculation of an embodiment.
Figure 10B:
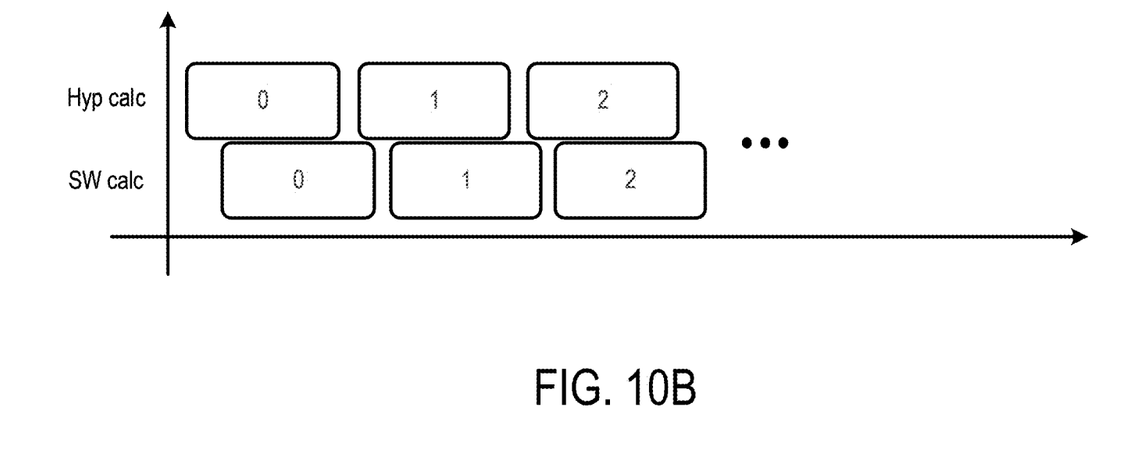

FIG. 9 is a diagram illustrating a parallelized hypothesis calculation and syndrome calculation of an embodiment where a parallel syndrome weight calculation is used. FIG. 9 is similar to FIG. 8, but, in FIG. 9, a read threshold hypothesis calculation 900 is provided to the input buffer 820. FIGS. 10A and 10B are diagrams illustrating a BES operation with parallel syndrome-weight calculation of an embodiment. As can be seen in these figures, the use of this embodiment greatly increases the efficiency of the BES operation and can reduce the BES latency by up to a factor of two.

Figure 11:
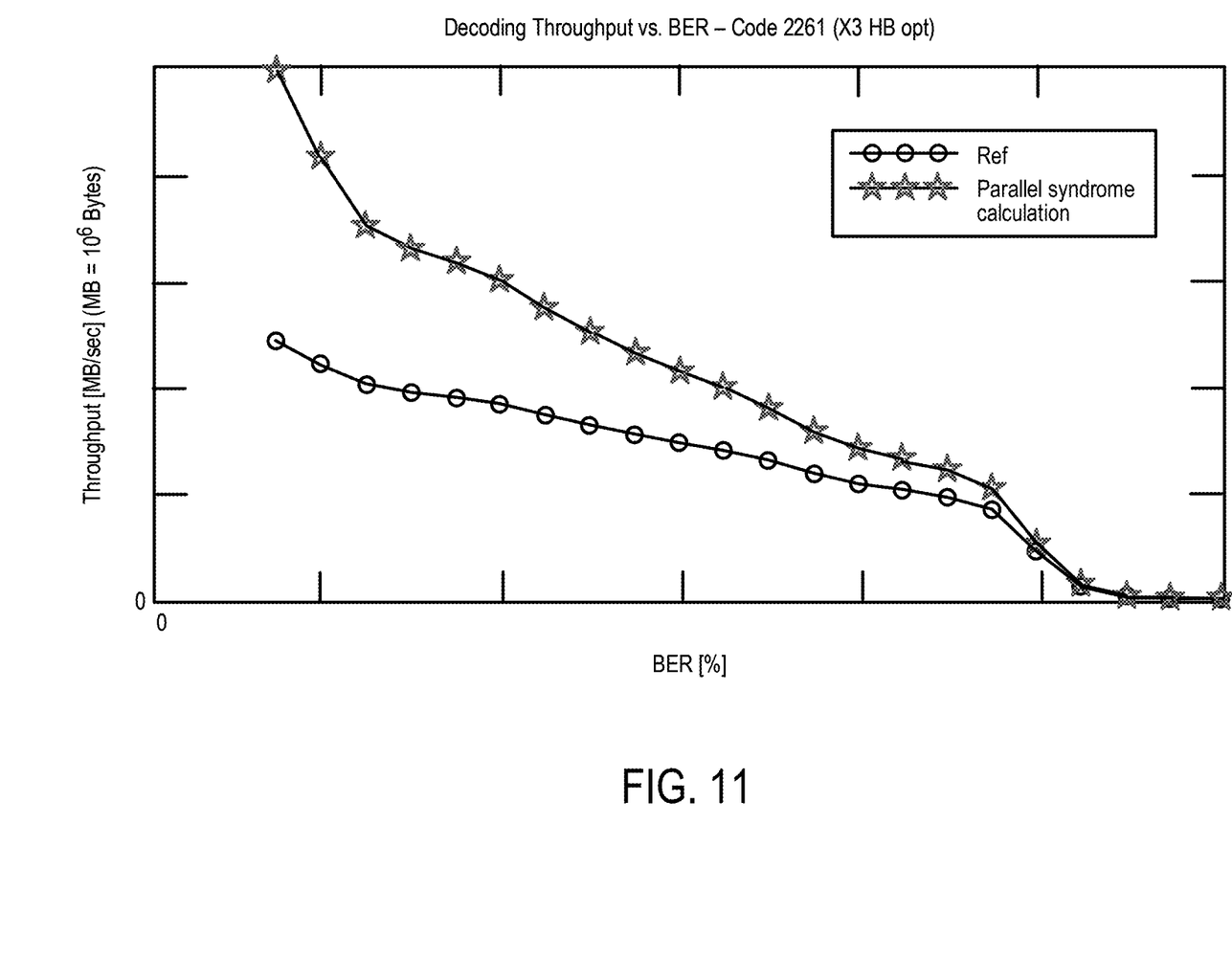
FIG. 11 is a graph of a decoding throughput comparison of an embodiment.

FIG. 11 is graph of a decoding throughput in MegaBytes per sec comparison of an embodiment, which shows the decoding performance for a single decoder in MB/sec as a function of the mean BER. This graph compares a reference system with a system of these embodiments. In the relevant BER performance range of one example implementation, the throughput gain can be on the order of 10% to 50%.

There are several advantages associated with these embodiments. For example, these embodiments can increase the throughput and the efficiency of the decoder pool by a significant amount with negligible impact to silicon cost (as it reuses existing, otherwise-idle decoder resources to calculate the syndrome in parallel to the decoder I/O operation). This increase can be translated into improved decoder performance (sustained target performance for higher BER), reduced decoder clock frequency (which reduces silicon area and power), and reduced number of decoder engines in the pool (reduced decoder parallelism, reduced decoder clock, and reduced decoder staging buffers all of which reduce silicon area). These embodiments can also improve BES, as they can significantly reduce the latency of the BES operation. This is especially important for X4 (four bits per cell) where the BES latency may be very high and/or for enterprise products, which are sensitive to QoS.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two-dimensional configuration, e.g., in an x-z plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three-dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A data storage device comprising:
   a memory;
   a decoder;
   an input buffer comprising a plurality of rows of storage locations; and
   one or more processors, individually or in combination, configured to:
      generate write pointers to indicate rows in the input buffer that are to be written as data read from the memory is stored in the input buffer; and
      after each row in the input buffer is written, send a read pointer to the decoder for that row;
   wherein:
      the decoder is configured to calculate a syndrome for data in a row of the input buffer in response to receiving the read pointer for that row instead of waiting for all rows in the input buffer to be written;
      a next row of the input buffer is written in parallel to calculating the syndrome for the data in the row; and
      a time to calculate the syndrome for the data in the row is less than a time to write data a next row in the input buffer.

2. The data storage device of claim 1, wherein the decoder is configured to perform iterative decoding.

3. The data storage device of claim 2, wherein the iterative decoding involves a low-density parity-check code.

4. The data storage device of claim 1, further comprising at least one additional decoder, wherein the decoder and the at least one additional decoder form a pool of decoders.

5. The data storage device of claim 4, wherein the one or more processors, individually or in combination, are further configured to pipeline data to the pool of decoders.

6. The data storage device of claim 1, wherein the one or more processors, individually or in combination, are further configured to use the syndrome to estimate a bit error rate.

7. The data storage device of claim 1, wherein the syndrome calculation consumes one decoding iteration.

8. The data storage device of claim 1, wherein the memory comprises a three-dimensional memory.

9. A data storage device comprising:
   a memory;
   a decoder;
   an input buffer comprising a plurality of rows of storage locations; and
   means for:
      generating write pointers to indicate rows in the input buffer that are to be written as data read from the memory is stored in the input buffer; and
      after each row in the input buffer is written, sending a read pointer to the decoder for that row;
   wherein:
      the decoder is configured to calculate a syndrome for data in a row of the input buffer in response to receiving the read pointer for that row instead of waiting for all rows in the input buffer to be written;
      a next row of the input buffer is written in parallel to calculating the syndrome for the data in the row; and
      a time to calculate the syndrome for the data in the row is less than a time to write data a next row in the input buffer.

10. In a data storage device comprising a memory, a decoder, and an input buffer comprising a plurality of rows of storage locations, a method comprising:
   generating write pointers to indicate rows in the input buffer that are to be written as data read from the memory is stored in the input buffer; and
   after each row in the input buffer is written, sending a read pointer to the decoder for that row;
   wherein:
      the decoder is configured to calculate a syndrome for data in a row of the input buffer in response to receiving the read pointer for that row instead of waiting for all rows in the input buffer to be written;
      a next row of the input buffer is written in parallel to calculating the syndrome for the data in the row; and
      a time to calculate the syndrome for the data in the row is less than a time to write data a next row in the input buffer.

11. The method of claim 10, wherein the decoder is configured to perform iterative decoding.

12. The method of claim 10, wherein the data storage device further comprises at least one additional decoder, wherein the decoder and the at least one additional decoder form a pool of decoders.

13. The method of claim 10, further comprising:
   pipelining data to the pool of decoders.

14. The method of claim 10, further comprising:
   using the syndrome to estimate a bit error rate.

15. The method of claim 10, wherein the syndrome calculation consumes one decoding iteration.

16. The method of claim 11, wherein the iterative decoding involves a low-density parity-check code.

* * * * *